United States Patent
Quek (10) Patent No.: US 9,148,959 B2
(45) Date of Patent: Sep. 29, 2015

(54) METHOD OF SUPPLYING POWER ON A CIRCUIT BOARD ASSEMBLY

(71) Applicant: Power Integrations, Inc., San Jose, CA (US)

(72) Inventor: Eng Hwee Quek, Singapore (SG)

(73) Assignee: Power Integrations, Inc., San Jose, CA (US)

( * ) Notice: Subject to any disclaimer, the term of this patent is extended or adjusted under 35 U.S.C. 154(b) by 165 days.

(21) Appl. No.: 14/060,017

(22) Filed: Oct. 22, 2013

(65) Prior Publication Data

US 2014/0033527 A1 Feb. 6, 2014

Related U.S. Application Data

(62) Division of application No. 13/088,268, filed on Apr. 15, 2011, now Pat. No. 8,570,768.

(51) Int. Cl.
| | |
|---|---|
| *H05K 3/30* | (2006.01) |
| *H01F 27/30* | (2006.01) |
| *H05K 7/02* | (2006.01) |
| *H01F 27/32* | (2006.01) |
| *H01F 27/06* | (2006.01) |

(52) U.S. Cl.
CPC ............... *H05K 3/30* (2013.01); *H01F 27/306* (2013.01); *H05K 7/02* (2013.01); *H01F 27/325* (2013.01); *H01F 2027/065* (2013.01); *Y10T 29/4913* (2015.01); *Y10T 29/49073* (2015.01)

(58) Field of Classification Search
USPC ......... 29/602.1, 605–606, 831, 832; 361/782, 361/811, 821, 836; 336/65, 90, 192, 196, 336/198, 200, 208
See application file for complete search history.

(56) References Cited

U.S. PATENT DOCUMENTS

| | | | |
|---|---|---|---|
| 4,117,436 A * | 9/1978 | MacLennan | ............... 336/65 |
| 4,149,135 A * | 4/1979 | Roespel et al. | ............. 336/65 |
| 4,498,067 A * | 2/1985 | Kumokawa et al. | ......... 336/65 |
| 4,893,105 A | 1/1990 | Maeda et al. | |
| 4,967,145 A | 10/1990 | Davies | |
| 6,937,129 B2 | 8/2005 | Hsueh et al. | |
| 7,023,314 B2 | 4/2006 | Tolle et al. | |
| 7,142,079 B2 | 11/2006 | Chang | |

(Continued)

OTHER PUBLICATIONS

"LNK362-364—LinkSwitch®-XT Family—Energy Efficient, Low Power Off-Line Switcher IC," Power Integrations, Inc., Rev. E 11/08, Nov. 2008, pp. 1-16.

(Continued)

*Primary Examiner* — Paul D Kim
(74) *Attorney, Agent, or Firm* — Blakely Sokoloff Taylor & Zafman LLP (57) ABSTRACT

Power is supplied on a circuit board assembly by attaching a drum core inductor to a circuit board. The drum core inductor has a first winding wound around the drum core inductor. The first winding has first and second ends coupled to the drum core inductor. A bobbin is attached to the circuit board. The bobbin has a second winding wound around the bobbin. The second winding has first and second ends coupled to the bobbin. The drum core inductor and the bobbin are attached to the circuit board. The drum core inductor is inside an opening of the bobbin. The drum core inductor and the bobbin are detached from each other. A power switch coupled to the first winding is switched to control a transfer of energy from an input power source through the first and second windings to a load coupled to the second winding.

10 Claims, 8 Drawing Sheets

(56) References Cited

U.S. PATENT DOCUMENTS

| | | | |
|---|---|---|---|
| 7,170,381 B2 | 1/2007 | Polivka et al. | |
| 7,898,822 B2 | 3/2011 | Feist et al. | |
| 8,203,415 B2 | 6/2012 | Wu et al. | |
| 8,487,733 B2 * | 7/2013 | Chu et al. | 336/212 |

OTHER PUBLICATIONS

"SL Series SL1215—Radial Lead Inductors (Coils) for Power Line," TDK, pp. 1/2-2/2, Jun. 2008.

"PQ Bobbins," TDK, pp. 50/72-51/72, Sep. 2004.

* cited by examiner

METHOD OF SUPPLYING POWER ON A CIRCUIT BOARD ASSEMBLY

CROSS-REFERENCE TO RELATED APPLICATIONS

This application is a divisional of U.S. patent application Ser. No. 13/088,268, filed on Apr. 15, 2011, now U.S. Pat. No. 8,570,678. U.S. patent application Ser. No. 13/088,268 is hereby incorporated by reference.

BACKGROUND INFORMATION

1. Field of the Disclosure

The present invention is related to the construction of electronic circuits. Specifically, it is related to an assembly of electronic circuit components for low-cost power supplies.

2. Background

Electronic circuits typically require a source of relatively low dc voltage to operate. The voltage is usually less than 15 volts. Portable electronic devices usually contain a battery as the source of dc voltage. Devices that operate from a source of ac voltage, such as the voltage available from an ordinary household wall outlet, require an ac-dc power supply to convert the ac input voltage that may be between 100 and 240 volts to the lower dc voltage that the electronic circuits require.

Ac-dc power supplies typically rely on the magnetic coupling between one or more coils of wire to scale voltages and to provide safety isolation between the relatively high ac voltage at the input and the relatively low dc voltage at the output. Manufacturers provide components known as transformers and coupled inductors that provide the required magnetic coupling and other desired features for use in power supplies. Coils of wire and pieces of magnetic material are usually assembled with clamps or adhesives into a single component for this purpose.

Transformers and coupled inductors typically contribute significantly to the cost of a power supply. A low-cost transformer assembly is desirable to reduce the cost of electronic power supplies.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for implementing a transformer assembly are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
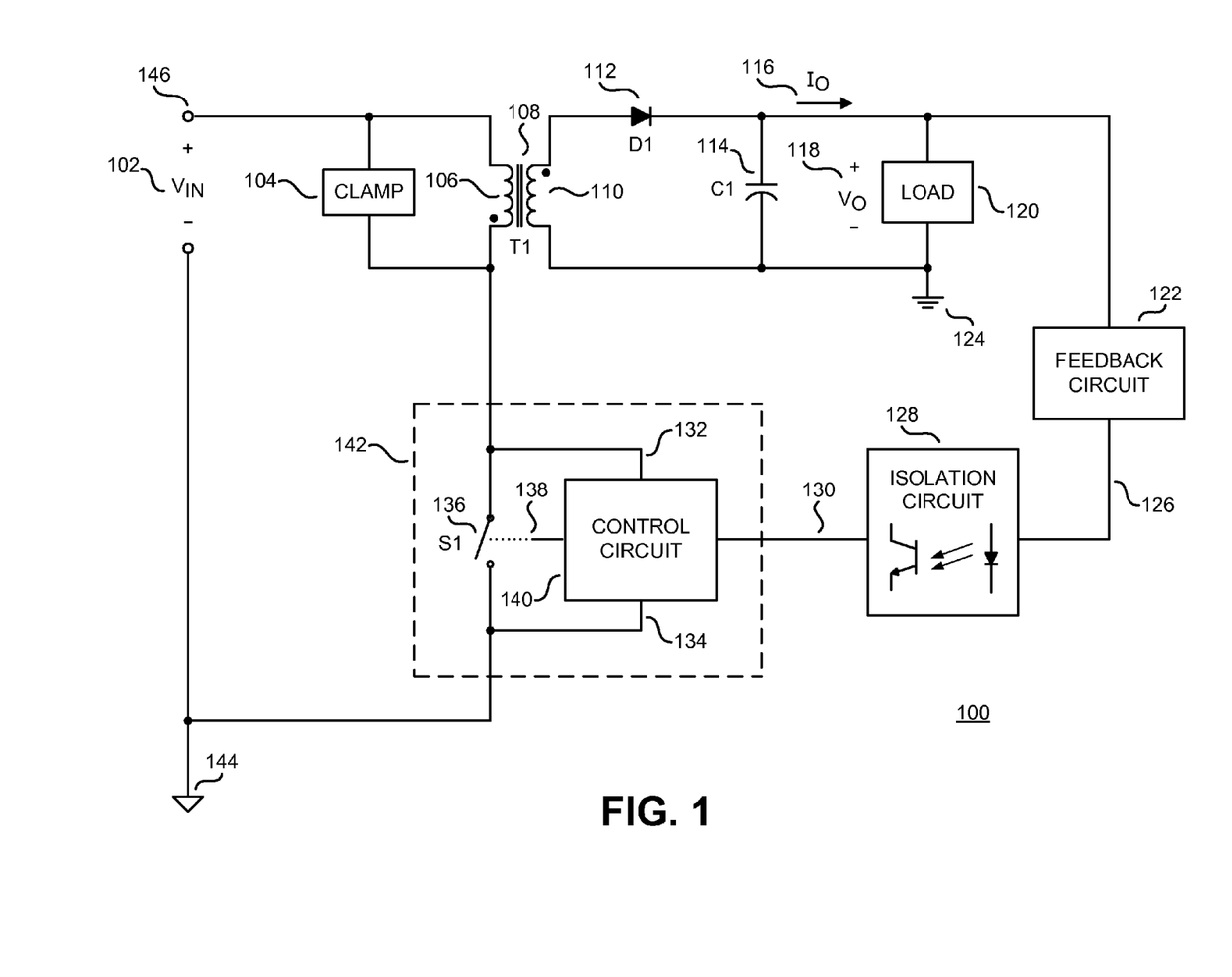
FIG. 1 is a schematic diagram that shows elements of an example power supply that uses a low-cost transformer assembly in accordance with the teachings of the present invention.

FIG. 1 is a schematic diagram showing the elements of an example power supply 100 that includes a low-cost transformer assembly 108 in accordance with the present invention. The power supply 100 in FIG. 1 is one example of a switching power supply that uses a flyback topology. One skilled in the art will appreciate that there are many known topologies and configurations of switching power supplies, and that the flyback topology is adequate to illustrate example application of the present invention that may apply also to other types of switching power supplies. Details that will be addressed later are omitted from FIG. 1 so as to avoid obscuring example functional elements according to the teachings of the present invention.

In the example illustrated in FIG. 1, power supply 100 provides regulated output voltage to a load 120 from a source of unregulated input voltage $V_{IN}$ 102. The input voltage $V_{IN}$ 102 is coupled to an energy transfer element T1 108 and a controller 142. In the example of FIG. 1, the energy transfer element T1 108 is a coupled inductor, which may sometimes be referred to as a transformer, with a primary winding 106 and a secondary winding 110. In the example of FIG. 1, primary winding 106 may be considered an input winding and secondary winding 110 may be considered an output winding. In the illustrated example, clamp circuit 104 is coupled to the primary winding 106 of the energy transfer element T1 108 to control the maximum voltage on the primary winding 106.

In the example illustrated in FIG. 1, input voltage $V_{IN}$ 102 is positive with respect to an input return 144, and output voltage $V_O$ 118 is positive with respect to an output return 124. The example of FIG. 1 shows galvanic isolation between the input return 144 and the output return 124. In other words, a dc voltage applied between input return 144 and output return 124 will produce substantially zero current. Therefore, circuits electrically coupled to the primary winding 106 are galvanically isolated from circuits electrically coupled to the secondary winding 110.

As shown in the depicted example, a controller 142 includes a switch S1 136 that either conducts current or does not conduct current in response to a control signal 138 from a control circuit 140 that is also included in controller 142. Controller 142 and control circuit 140 may include integrated circuits and discrete electrical components. In some examples, controller 142, switch S1 136, and control circuit 140 may be included in a single monolithic integrated circuit.

In the example power supply of FIG. 1, the switching of switch S1 136 produces a pulsating current in secondary winding 110. Current from secondary winding 110 is rectified by output diode D1 112 and filtered by output capacitor C1 114 to provide an output voltage $V_O$ 118 and output current $I_O$ 116 to the load 120. In the example of FIG. 1, a feedback circuit 122 senses the output voltage $V_O$ 118 to provide an output feedback signal 126. An isolation circuit 128 provides an isolated feedback signal 130 to control circuit 140.

In the example of FIG. 1, control circuit 140 receives energy for operation through supply terminals 132 and 134 that are coupled across the terminals of switch S1 136. When switch S1 136 is open, control circuit 140 stores energy received from the source of unregulated input voltage $V_{IN}$ 102. In one example, control circuit 140 may store energy in a capacitor not shown in FIG. 1. When switch S1 136 is closed, control circuit 140 operates from the energy stored during the time when switch S1 136 is open.

In the example of FIG. 1, control circuit 140 receives the isolated feedback signal 130 from an isolation circuit 128 to provide the control signal 138 that switches switch S1 136 with a duration and frequency to maintain a desired value of output voltage $V_O$ 118 at the load 120. In other examples, energy transformer element T1 108 may have additional output windings, each with their respective output diodes and output capacitors to produce additional output voltages at additional loads in accordance with the teachings of the present invention.

Figure 2:
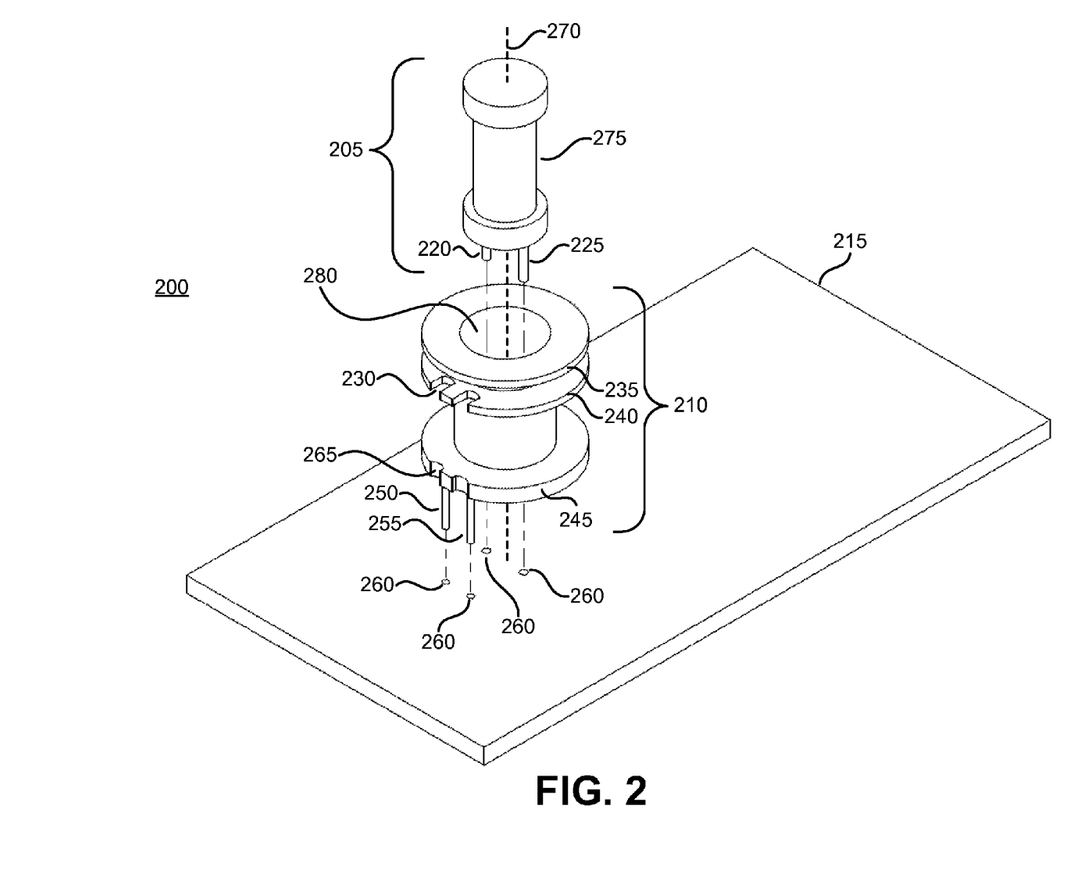
FIG. 2 shows an exploded view of a low-cost transformer assembly in accordance with the teachings of the present invention with windings removed to expose selected features.

FIG. 2 is an exploded view 200 of one example of a low-cost transformer assembly in accordance with the teachings of the present invention. It is noted that in the illustration depicted in FIG. 2, wires are not shown with the other example components of the assembly to show the components in greater detail. The example assembly includes a circuit board 215, a drum core inductor 205 that is shown with wire removed, and a bobbin 210 that is also shown with wire removed.

The drum core inductor 205 with wire removed in the example of FIG. 2 shows details of an example cylindrical core 275 that has a reduced diameter adapted to hold turns of wire along a portion of an axis 270. The example core 275 in FIG. 2 has a circular cross section perpendicular to the axis 270, although in another example the core may have a cross section of different shape such as for example a square, a rectangle, an ellipse, or the like. A first terminal 220 and a second terminal 225 extend from a first end of the core. In one example, the core is of a material of relatively high magnetic permeability and relatively high electrical resistivity such as for example ferrite. In one example, the terminals 220 and 225 are of a material of relatively high electrical conductivity, such as for example copper or steel with a coating of a different metal that is resistant to corrosion.

The bobbin 210 with wire removed in the example of FIG. 2 shows details of an example cylindrical spool adapted to hold turns of wire along a portion of an axis 270 between a first flange 245 at a first end of the bobbin and a second flange 240. The example of FIG. 2 also shows a third flange 235 at a second end of the bobbin 210. A first terminal 255 and a second terminal 250 extend from the first end of the bobbin 210. In the example of FIG. 2, the first terminal 255 and the second terminal 250 extend from the first flange 245 at the first end of the bobbin 210. In other examples, more than two terminals may extend from the bobbin in a low-cost transformer assembly in accordance with the teachings of the present invention.

In one example, bobbin 210 is constructed from an electrically insulating material such as for example a synthetic resin. In one example, the terminals 255 and 250 are of a material of relatively high electrical conductivity such as copper or steel with a coating of a different metal that is resistant to corrosion.

As illustrated in the example of FIG. 2, bobbin 210 has a recess 230 in the second flange 240 and a recess 265 in the first flange 245. Wire may pass through recesses in the flanges as the wire goes between the terminals of the bobbin.

As shown in the depicted example, bobbin 210 has an opening 280 along the axis 270. In the example of FIG. 2, the opening 280 is has a circular boundary in a plane perpendicular to the axis 270. In one example, the opening 280 is large enough for the drum core inductor 205 to pass through the opening 280 without any part of drum core inductor 205 touching any part of bobbin 210. In another example, the drum core inductor 205 may touch the bobbin 210 as the drum core inductor 205 passes through the opening 280. In yet another example, the drum core inductor 205 may touch the bobbin 210 in the opening 280 to produce a frictional force between the drum core inductor 205 and the bobbin 210 that maintains a relative position between the drum core inductor 205 and the bobbin 210 in the absence of an attachment either inside the opening 280 or external to the opening 280, the frictional force preventing the force of gravity from changing the relative position between the drum core inductor 205 and the bobbin 210.

As shown in the example of FIG. 2, circuit board 215 has openings 260 that are arranged to allow terminals 220, 225, 250 and 255 to pass through the circuit board and to be attached to the circuit board with solder. In another example, circuit board 215 may have conductive pads on a surface of the circuit board to allow terminals 220, 225, 250, and 255 to be attached to the circuit board without passing through the circuit board. In yet another example, circuit board 215 may have an opening such as a slot to allow a non-conducting structure extending from the first end of the bobbin (not shown in FIG. 2) to pass through the circuit board.

Figure 3:
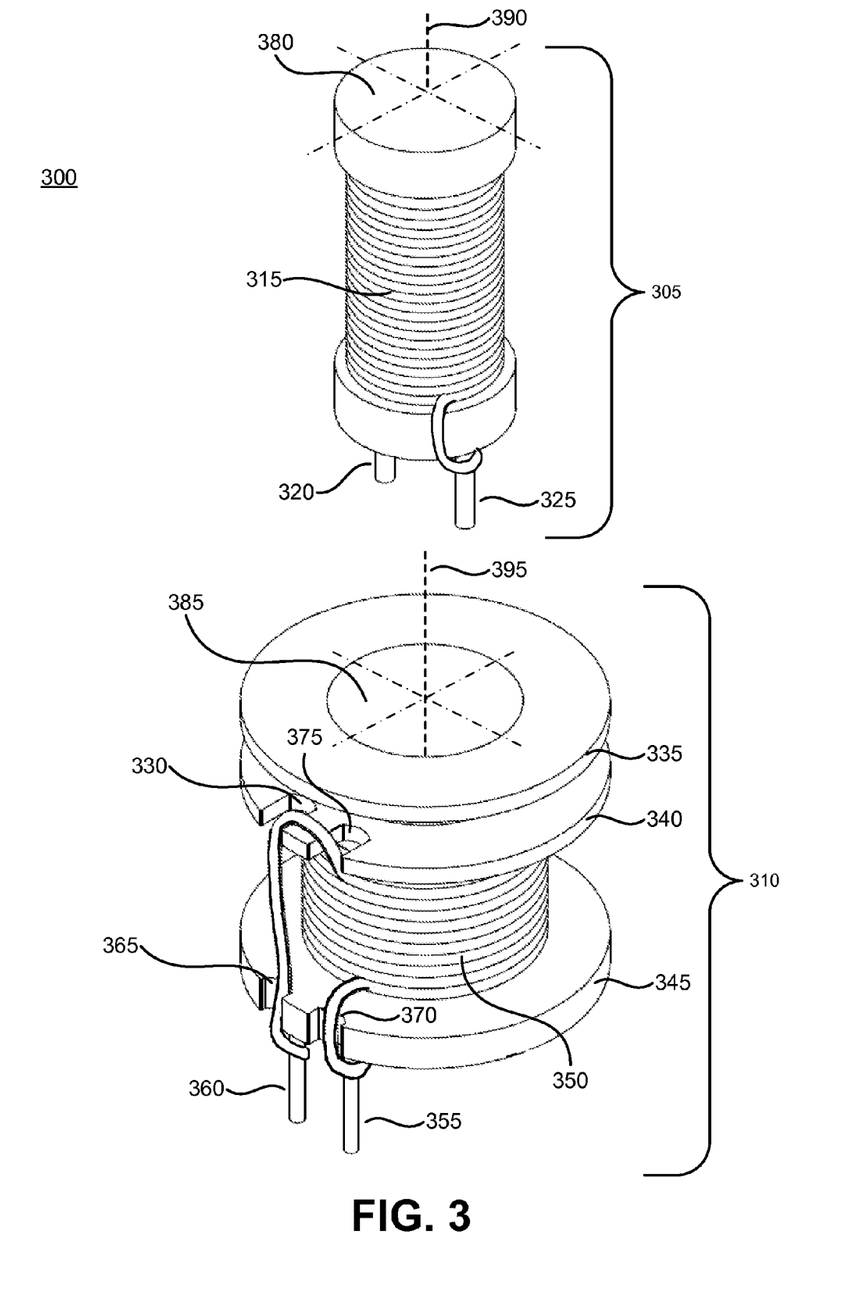
FIG. 3 is an exploded view of two elements of a low-cost transformer assembly showing the windings in accordance with the teachings of the present invention.

FIG. 3 is an exploded view 300 showing two parts of one example of a low-cost transformer assembly wound with wire in accordance with the teachings of the present invention. As shown in the depicted example, inductor 305 includes a first winding 315 wound around an axis 390 of the drum core 380. In one example, first winding 315 has a first end coupled to a first terminal 325 extending from a first end of the drum core 380. A second end of first winding 315 is coupled to a second terminal 320 extending from the first end of the drum core inductor 380. In the specific example shown of FIG. 3, it is noted that the coupling of the second end of first winding 315 to the second terminal 320 is behind the drum core 380 in the illustration out of view.

Bobbin 310 in the example of FIG. 3 has a wire of a second winding 350 wound around an axis 395 of the bobbin. In the example, the second winding has first and second ends that are coupled to a first terminal 355 and a second terminal 360, respectively, which extend from a first end of the bobbin as shown. As shown in the example, bobbin 310 has a first recess 370 and a second recess 365 defined along an edge of a first flange 345 at the first end of the bobbin 310. The wire of the second winding 350 passes into the first recess 370 and the second recess 365. Recesses 370 and 365 fix a position of the wire of the second winding 350 between the first terminal 355 and second terminal 360 of the bobbin 310. In another example, a single recess may fix the position of the wire within the flange 345.

Bobbin 310 in the example of FIG. 3 has a second flange 340 along the axis 395 of the bobbin. The wire of the second winding is wound around the axis 395 of the bobbin 310 between the first flange 345 and the second flange 340. Bobbin 310 has a third recess 375 and a fourth recess 330 defined along an edge of the second flange 340. The wire of the second winding 350 passes into the third recess 375 and the fourth recess 330 to fix a position of the wire of the second winding 350 between the first terminal 355 and second terminal 360 of the bobbin 310.

In one example, bobbin 310 also includes a third flange 335 along the axis 395 at a second end of the bobbin. The second flange 340 is between the first flange 345 and third flange 335 as shown in the illustrated example. In one example, the distance between the second flange 340 and the third flange 335 along the axis 395 is chosen to help provide a sufficient minimum creepage distance along the surface of bobbin 310 between any part of winding 350 and any part of drum inductor 305 when the drum inductor 305, the bobbin 310, and the circuit board 215 are assembled into the low-cost transformer assembly.

In one example, when the low-cost transformer is assembled, drum inductor 305 is positioned within opening 385 of bobbin 310. Since the relative polarities of the windings of a transformer are typically important to the operation of electrical circuits, drum inductor 305 may have mechanical features such as markings or terminals of different lengths to indicate the proper orientation of terminals 320 and 325 with respect to terminals 355 and 360 of bobbin 310. In the example, drum inductor 305 and bobbin 310 are attached individually to circuit board 215, which is illustrated for example in FIG. 2. In the example, drum inductor 305 and bobbin 310 are not attached to each other when they are attached to circuit board 215 in accordance with the teachings of the present invention.

In one example, drum inductor 305 and bobbin 310 are attached to the circuit board 215 with solder at their respective terminals. In the example, the attachment of the drum inductor 305 and bobbin 310 to the circuit board 215 may provide electrical connections to other components on the circuit board 215 that are part of an electrical circuit such as a power supply.

Figure 4A:
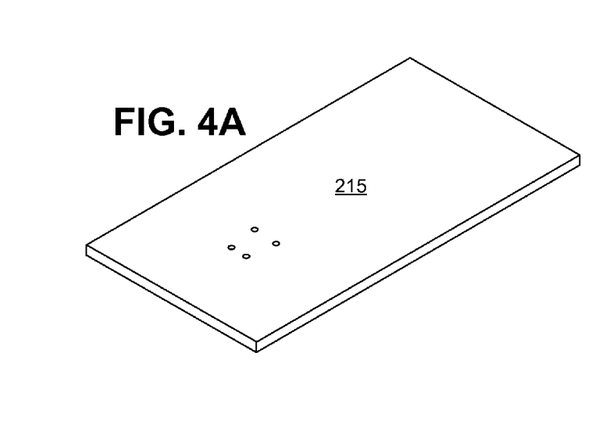
FIGS. 4A to 4C are mechanical drawings that show steps to assemble elements of a low-cost transformer assembly in accordance with the teachings of the present invention.
Figure 4B:
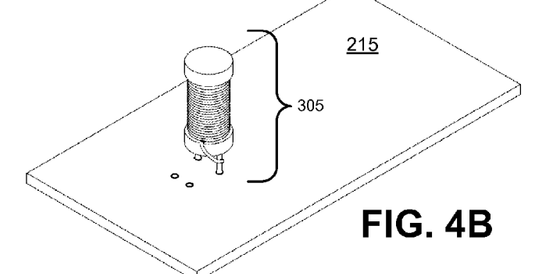
Figure 4C:
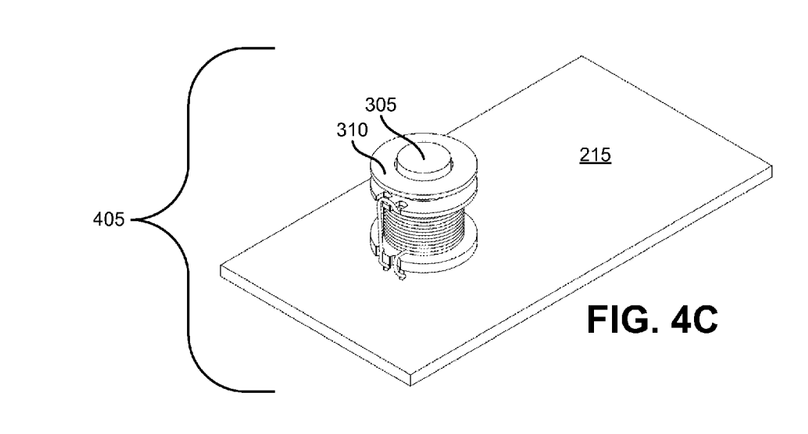

FIGS. 4A to 4C illustrate a mechanical drawing 400 that shows example intermediate steps in one method of assembling elements of a low-cost transformer assembly that may supply power on a circuit board assembly in accordance with the teachings of the present invention. For instance, FIG. 4A shows a circuit board 215 without components. In another example circuit board 215 may hold components typically found for example in a power supply. FIG. 4B shows a drum core inductor 305 positioned on circuit board 215. In one example, drum core inductor 305 in FIG. 4B may be attached to circuit board 215 by solder. FIG. 4C shows an example completed low-cost transformer assembly 405 after a bobbin 310 has been placed on the circuit board 215 with the drum inductor 305 inside an opening of the bobbin 310 in accordance with the teachings of the present invention. In one example, the bobbin 310 may be attached to the circuit board 215 with solder. The bobbin 310 and the drum core inductor 305 are not attached to each other in the low-cost transformer assembly 405 in accordance with the teachings of the present invention. In another example, the drum inductor 305 and the bobbin 310 may be held together temporarily in the proper orientation to allow simultaneous placement of both on the circuit board before attachment to the circuit board.

Figure 5:
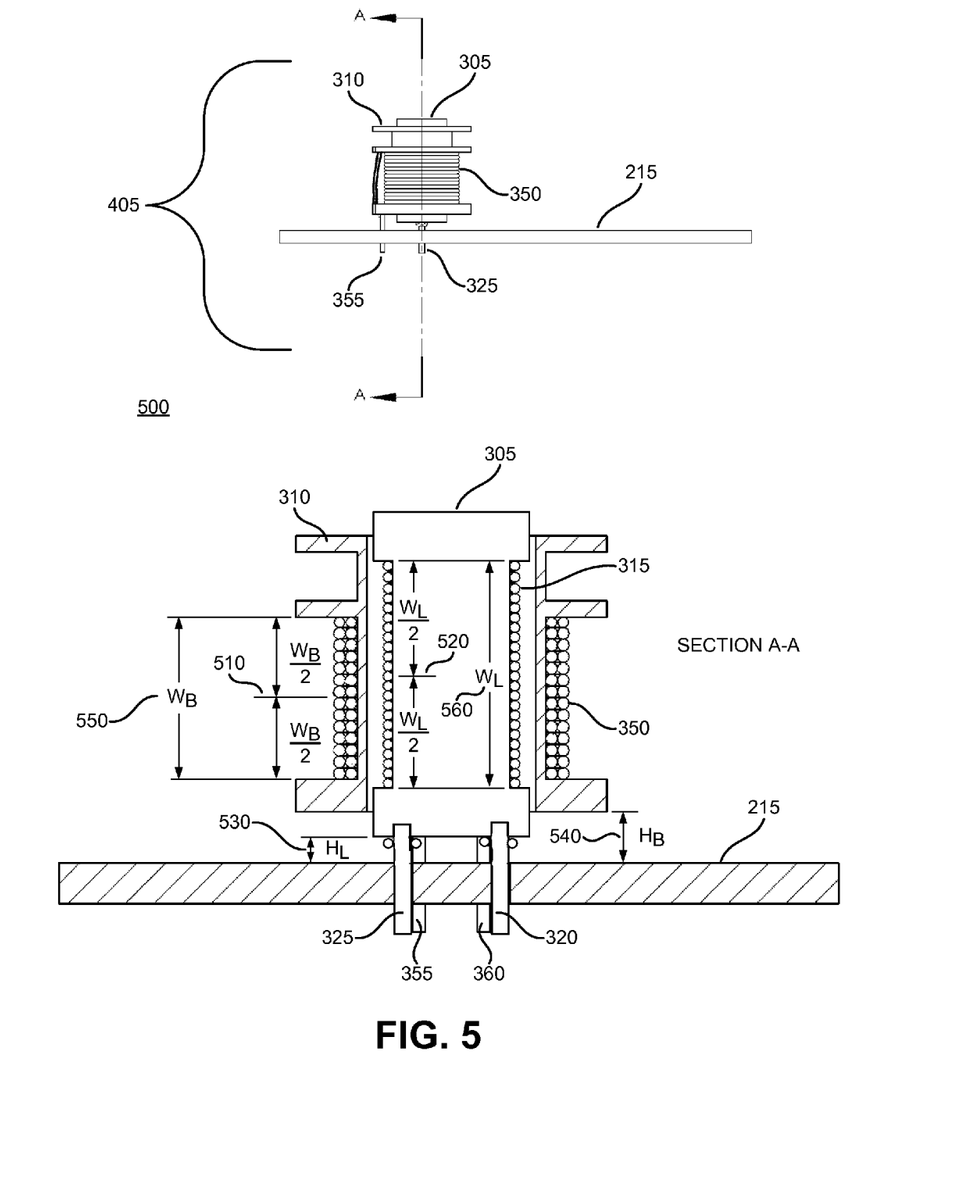
FIG. 5 is a cross section of one example of a low-cost transformer assembly in accordance with the teachings of the present invention.

FIG. 5 is a mechanical drawing 500 that shows a cross-sectional view of one example of a low-cost transformer assembly 405 in accordance with the teachings of the present invention. The view of the section A-A shows example dimensions of the windings 315 and 350 of the drum core inductor 305 and bobbin 310, respectively, in accordance with the teachings of the present invention.

For instance, in the example of FIG. 5, winding 315 of drum core inductor 305 is a single layer of many turns positioned side-by-side over a length $W_L$ 560 along the axis of the drum core inductor 305. In the example, length $W_L$ 560 is the distance along the axis of the drum core inductor 305 between the turns of winding 315 that are farthest apart. The center 520 of winding 315 is half the distance between the turns of winding 315 that are farthest apart.

In the example illustrated in FIG. 5, winding 350 of bobbin 310 has two layers of many turns positioned side-by-side over a length $W_B$ 550 along the axis of the bobbin 310. In the example, length $W_B$ 550 is the distance along the axis of bobbin 310 between the turns that are farthest apart. The center 510 of winding 350 is half the distance between the turns of winding 350 that are farthest apart.

In one example, to achieve the best magnetic coupling between winding 315 and winding 350, the length $W_L$ 560 of winding 315 will be approximately the same as the length $W_B$ 550 of winding 350. In addition, for the best magnetic coupling, the center 520 of winding 315 and the center 510 of winding 350 in one example are substantially the same distance from a surface of the circuit board 215 in accordance with the teachings of the present invention.

Figure 6:
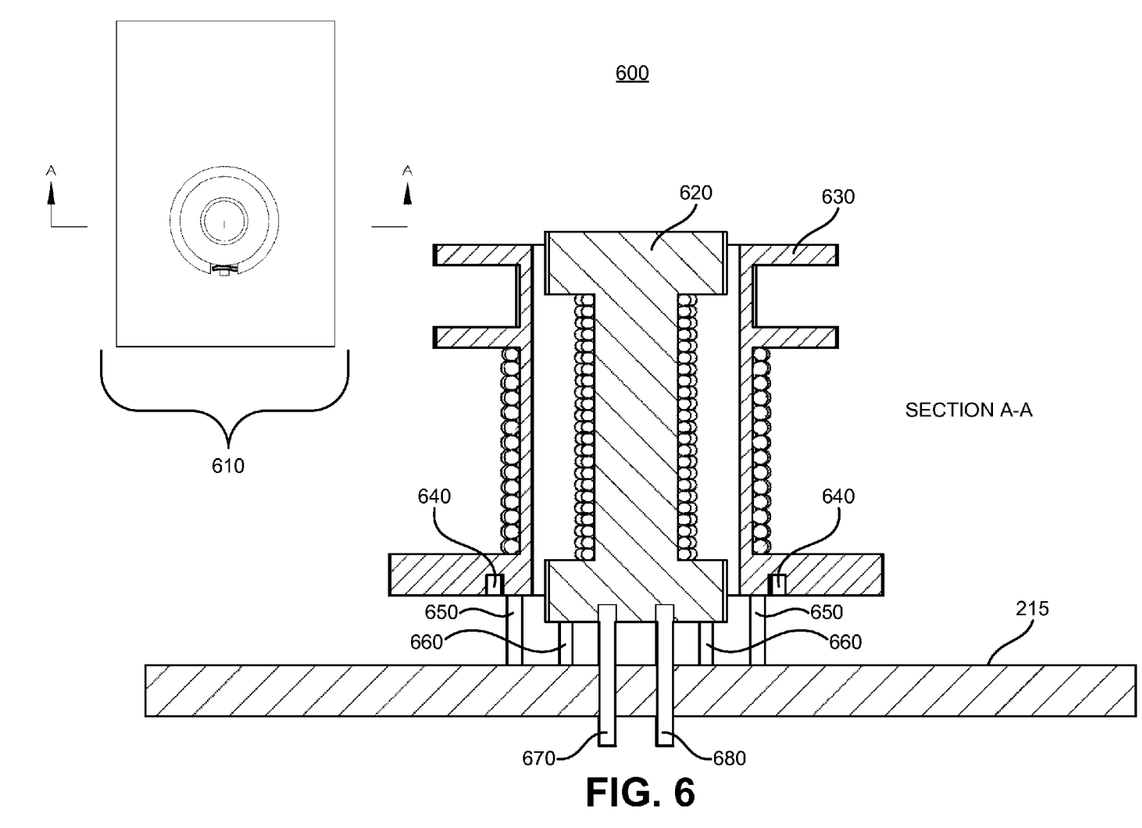
FIG. 6 is a cross section of another example of a low-cost transformer assembly showing optional features in accordance with the teachings of the present invention.

In one example, the relative positions of the windings 315 and 350 may be adjusted with respect to the surface of the circuit board 215 by fixing the distance $H_L$ 530 on the drum core inductor 305 and the distance $H_B$ 540 on the bobbin 310 when the components are attached to circuit board 215 in accordance with the teachings of the present invention. In one example, desired values for distances $H_L$ 530 and $H_B$ 540 may be realized with the use of a spacer between the circuit board 215 and the drum core inductor 305, between the circuit board 215 and the bobbin 310, or both. In one example, a spacer may be a separate piece that is attached to the drum core inductor 305 or the bobbin 310 or the circuit board 215 before the drum core inductor 305 or the bobbin 310 is attached to the circuit board 215. In another example, a spacer may be designed into the structure of the drum core inductor or the bobbin as illustrated in FIG. 6 below. A spacer designed into the structure is also known as a standoff.

FIG. 6 is a mechanical drawing 600 that shows a cross-sectional view of an example low-cost transformer assembly 610 to illustrate optional features. As illustrated in the example of FIG. 6, section A-A shows a cross-section of an optional spacer 660 between one end of the drum core inductor 620 and the circuit board 215. Section A-A in the example of FIG. 6 also shows an optional spacer 650 between one end of the bobbin 630 and circuit board 215. Section A-A in the example of FIG. 6 also shows a groove 640 in one end of the bobbin 630.

The addition of optional features such as spacer 650 and groove 640 may beneficial in one example to increase the distance over the surface of the bobbin 630 between conductors coupled to the input of a power supply and conductors coupled to the output of the power supply. This distance is known in the art as creepage distance, and is typically required to be a minimum value to meet the requirements of safety agencies.

Figure 7:
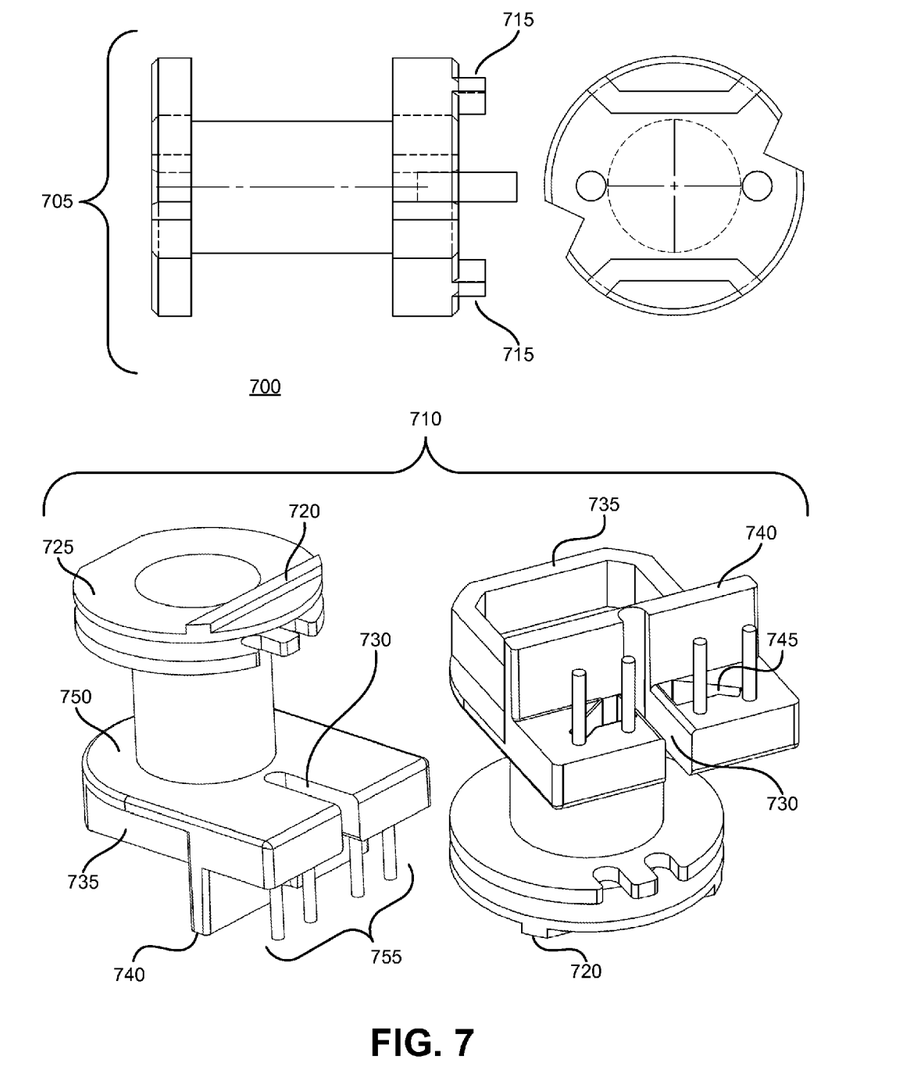
FIG. 7 shows another example of two parts of a low-cost transformer assembly with optional features in accordance with the teachings of the present invention.

FIG. 7 is a mechanical drawing 700 showing two pieces of an example low-cost transformer assembly with optional features in accordance with the present invention. In the illustrated example, drum core 705 is shown without wire and terminals to avoid obscuring the spacers 715 that protrude from one end. An example bobbin 710 is shown without wire to avoid obscuring several optional features.

In the example of FIG. 7, bobbin 710 has a single recess 730 in the flange 750 to fix the location of wire from windings that would couple to terminals 755. The example bobbin 710 in FIG. 7 has four terminals 755 to accommodate two secondary windings for two separate outputs.

In the example of FIG. 7, bobbin 710 has a barrier 720 on the flange 725. Bobbin 710 in the example of FIG. 7 also has a spacer 735, a barrier 740, and a groove 745 on the flange 750. The example bobbin 710 with optional features may be desirable for a low-cost transformer assembly in a power supply. The optional barriers 720, 740, and grooves 745 increase the creepage distance between conductors coupled to the input of the power supply and conductors coupled to the output of the power supply.

When in a low-cost transformer assembly for a power supply, barrier 740 on bobbin 710 would pass through a slot in the circuit board of the low-cost transformer assembly to provide additional creepage distance to terminals 755 that typically couple to the output of the power supply.

Figure 8:
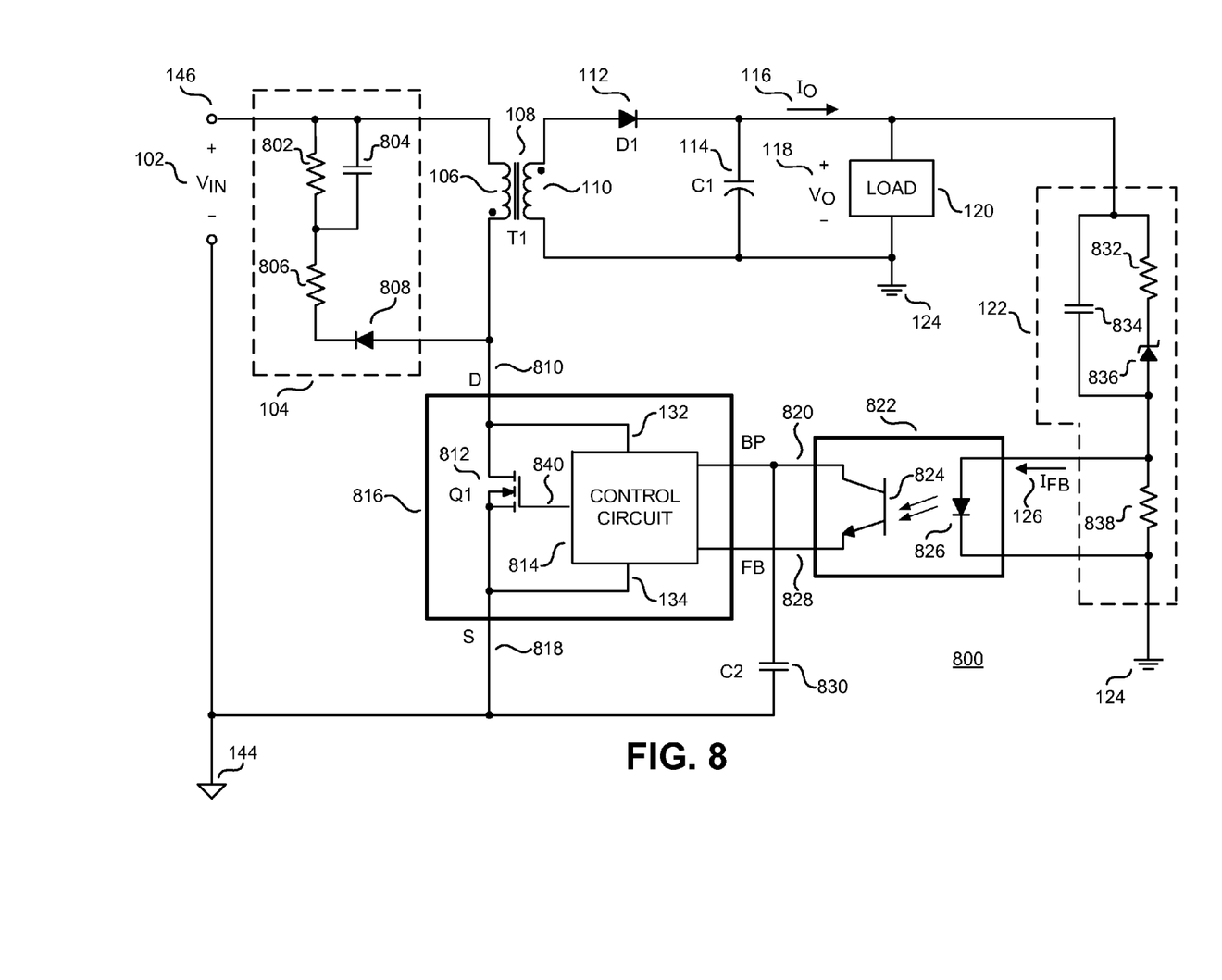
FIG. 8 is a schematic diagram of an example power supply that uses a low-cost transformer assembly in accordance with the present invention.

FIG. 8 is a schematic diagram 800 that shows additional detail of one practical power supply example that includes a low-cost transformer assembly 108 in accordance with the teachings of the present invention. In the example power supply of FIG. 8, clamp circuit 104 includes capacitor 804, diode 808, resistor 802 and resistor 806 coupled together as shown. Feedback circuit 122 in the example power supply of FIG. 8 includes resistor 832, capacitor 834, Zener diode 836, and resistor 838 coupled together as shown. The example power supply of FIG. 8 includes an integrated circuit controller 816 that may be for example the LNK364 device available from Power Integrations of San Jose, Calif.

In the example power supply of FIG. 8, feedback circuit 122 provides a feedback signal representative of the output of the power supply. In one example, the feedback signal is a feedback current $I_{FB}$ 126 to the light-emitting diode (LED) 826 of an isolation circuit 822 that is an optocoupler. A phototransistor 824 in isolation circuit 822 provides an isolated feedback signal to a feedback terminal FB 828 of a control circuit 814.

In the example power supply of FIG. 8, control circuit 814 provides a control signal 840 to the gate of transistor Q1 812 that is a metal oxide semiconductor field effect transistor (MOSFET). Transistor Q1 812 is coupled to one end of primary winding 106 of the low-cost transformer assembly 108 at a drain terminal 810 of integrated circuit controller 816. Transistor Q1 812 is coupled to the primary return 144 at a source terminal 818 of integrated circuit controller 816. In one example, control signal 814 switches transistor Q1 812 with a duration and frequency to maintain a desired value of output voltage $V_O$ 118 at the load 120.

In the example power supply of FIG. 8, control circuit 814 receives energy for operation through supply terminals 132 and 134 that are coupled across the terminals of transistor Q1 812. When transistor Q1 812 is switched off (i.e., not conducting), control circuit 814 stores energy received from the source of unregulated input voltage $V_{IN}$ 102, storing energy in a capacitor C2 830 coupled to a bypass terminal BP 820. When transistor Q1 812 is switched on (i.e., may conduct current), control circuit 814 operates from the energy stored in capacitor C2 830.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of supplying power on a circuit board assembly, comprising:
    attaching a drum core inductor to a circuit board, the drum core inductor having a first winding wound around an axis of a drum core of the drum core inductor, the first winding having first and second ends coupled to first and second terminals of the drum core inductor;
    attaching a bobbin to the circuit board, the bobbin having a second winding wound around an axis of the bobbin, the second winding having first and second ends coupled to first and second terminals of the bobbin, respectively, wherein the drum core inductor and the bobbin are attached to the circuit board such that the drum core inductor is positioned on the circuit board inside an opening of the bobbin defined along the axis of the bobbin, wherein the drum core inductor and the bobbin are detached from each other; and
    switching a power switch coupled between an input power source and the first winding to control a transfer of energy from the input power source through the first and second windings to an output at a load coupled to the second winding.

2. The method of claim 1 further comprising winding the second winding around the bobbin between first and second flanges along the axis of the bobbin prior to performing the step of attaching the bobbin to the circuit board.

3. The method of claim 2 further comprising passing the second winding into recesses defined in the first and second flanges when performing the step of winding the second winding around the bobbin between first and second flanges.

4. The method of claim 1 further comprising setting a distance from a center of the first winding along the axis of the drum core inductor to a surface of the circuit board to be substantially equal to a distance from a center of the second winding along the axis of the bobbin to the surface of the circuit board when performing the step of attaching the drum core inductor and the bobbin to the circuit board.

5. The method of claim 1 further comprising receiving a feedback signal representative of the output from a feedback circuit coupled to the load, wherein the switching of the power switch is performed in response to the feedback signal.

6. The method of claim 5 further comprising isolating the feedback circuit from a control circuit coupled to switch the power switch with an isolation circuit coupled between the control circuit and the feedback circuit.

7. The method of claim 1 further comprising clamping a voltage across the first winding with a clamp circuit coupled between the first and second ends of the first winding.

8. The method of claim 1 wherein the step of attaching the drum core inductor to the circuit board is performed prior to the step of attaching the bobbin to the circuit board.

9. The method of claim 1 wherein the step of attaching the bobbin to the circuit board is performed prior to the step of attaching the drum core inductor to the circuit board.

10. The method of claim 1 wherein the drum core inductor and the bobbin are simultaneously attached to the circuit board.

\* \* \* \* \*